Figure 1:
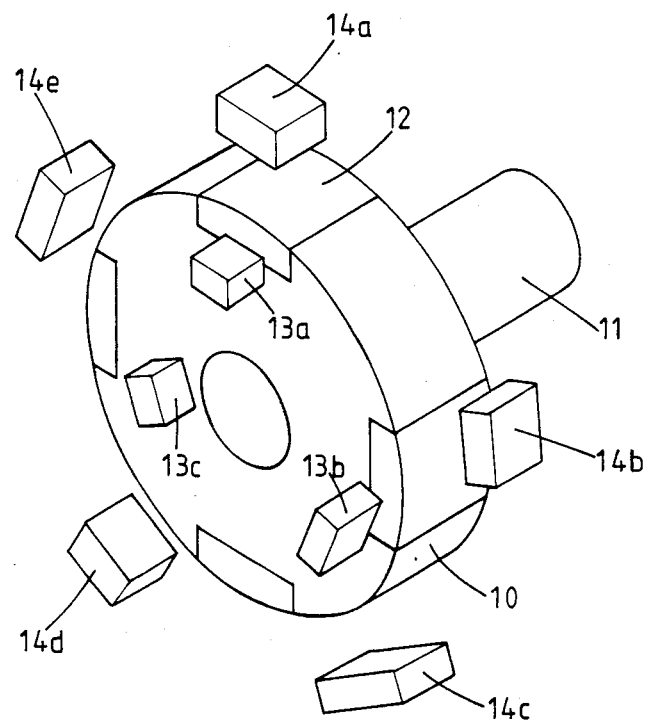

United States Patent [19]

Carrigan et al.

[11] Patent Number: 4,758,769
[45] Date of Patent: Jul. 19, 1988

[54] APPARATUS FOR SENSING DIRECTION OF ROTATION

[75] Inventors: Thomas F. Carrigan; Charles A. Maltby, both of Bradford, England

[73] Assignee: Lucas Industries Public Limited Company, Birmingham, England

[21] Appl. No.: 936,793

[22] Filed: Dec. 2, 1986

[30] Foreign Application Priority Data

Dec. 19, 1985 [GB] United Kingdom ............... 8531235

[51] Int. Cl.⁴ .................. H02K 23/00; G05B 5/00
[52] U.S. Cl. ........................... 318/254; 318/138; 318/326
[58] Field of Search ............ 318/653, 254 A, 254, 318/138, 280, 664, 723, 314, 439, 326, 327

[56] References Cited

U.S. PATENT DOCUMENTS

| | | | |
|---|---|---|---|
| 3,678,358 | 7/1972 | Kolatorowicz | 318/254 |
| 4,072,881 | 2/1978 | Ban | 318/138 |
| 4,258,299 | 3/1981 | Takeda | 318/254 X |

Primary Examiner—William M. Shoop, Jr.
Assistant Examiner—Patrick C. Keane
Attorney, Agent, or Firm—Holman & Stern

[57] ABSTRACT

Direction of rotation of a device is sensed by means of a rotor which is coupled to the device and which carries at least two permanent magnets which are angularly spaced and present opposite magnetic poles to two sensors. One of the sensors is responsive to one only of the magnetic polarities to produce a voltage signal and the other sensor produces a voltage signal whose polarity is dependent on the polarity and direction of rotation of the magnet which induces that signal. The two detector voltage are compared and their correspondence or otherwise indicates the direction of rotation.

7 Claims, 5 Drawing Sheets

FIG.I.

APPARATUS FOR SENSING DIRECTION OF ROTATION

This invention relates to apparatus for sensing direction of rotation, in particular of rotation of a shaft of a permanent magnet electric motor, which may be a brushless motor.

It is known from GB No. 2079979A to provide an apparatus for determining direction of rotation of the shaft of a d.c. motor, this apparatus including means for generating a digital code which corresponds to a detected instantaneous angular position of the shaft, a digital store which, based on the detected angular position, generates codes which correspond to the next subsequent angular positions which could result from clockwise and anti-clockwise rotations respectively. The next detected position is compared with the aforesaid generated codes, and correspondence with one of these codes indicates the rotational direction. It is a disadvantage of the prior art apparatus that a directional indication is not provided instantaneously for any rotational position, but must await rotation of the shaft to its next detected angular position.

It is an object of the invention to provide a brushless apparatus which provides an immediate indication of the direction of rotation of a shaft.

According to the invention there is provided an apparatus for sensing the direction of rotation of a device, comprising a rotor for rotation with said device, first and second detectors mounted on a relatively fixed part of said apparatus, at least one pair of magnets mounted on said rotor so as respectively to present opposite magnetic poles to said first detector, said first detector device being responsive to the flux from said magnets for providing a first voltage signal whose polarity is dependent on the polarity and direction of rotation of an adjacent one of said magnetic poles, and said second detector providing a second voltage signal substantially coincident with one polarity of said first signal, means for comparing the voltage signals from said first and second detectors and means for providing first or second indicating signals dependent on correspondence or otherwise of said voltage signals.

Figure 2:
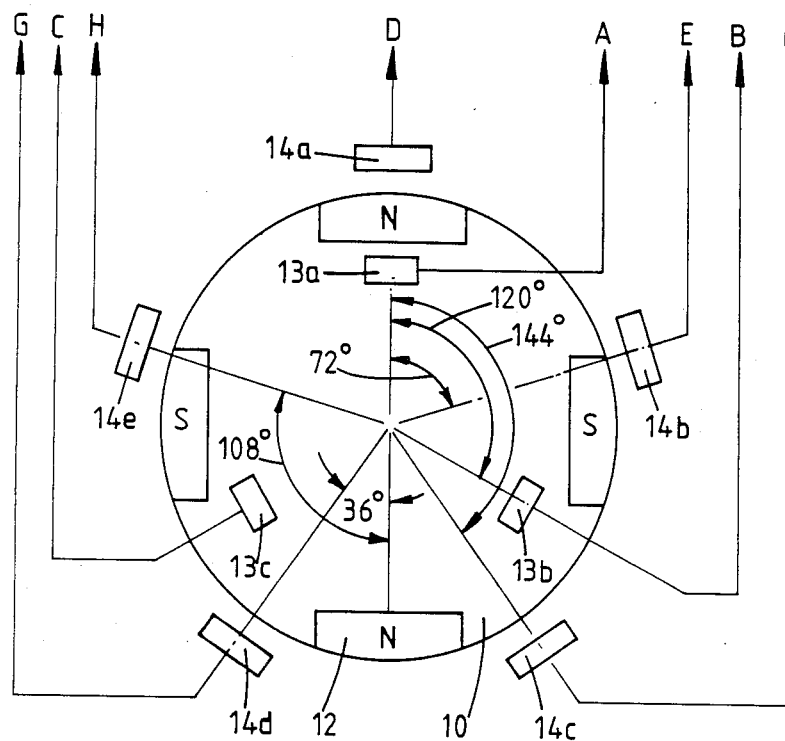
Figure 3:
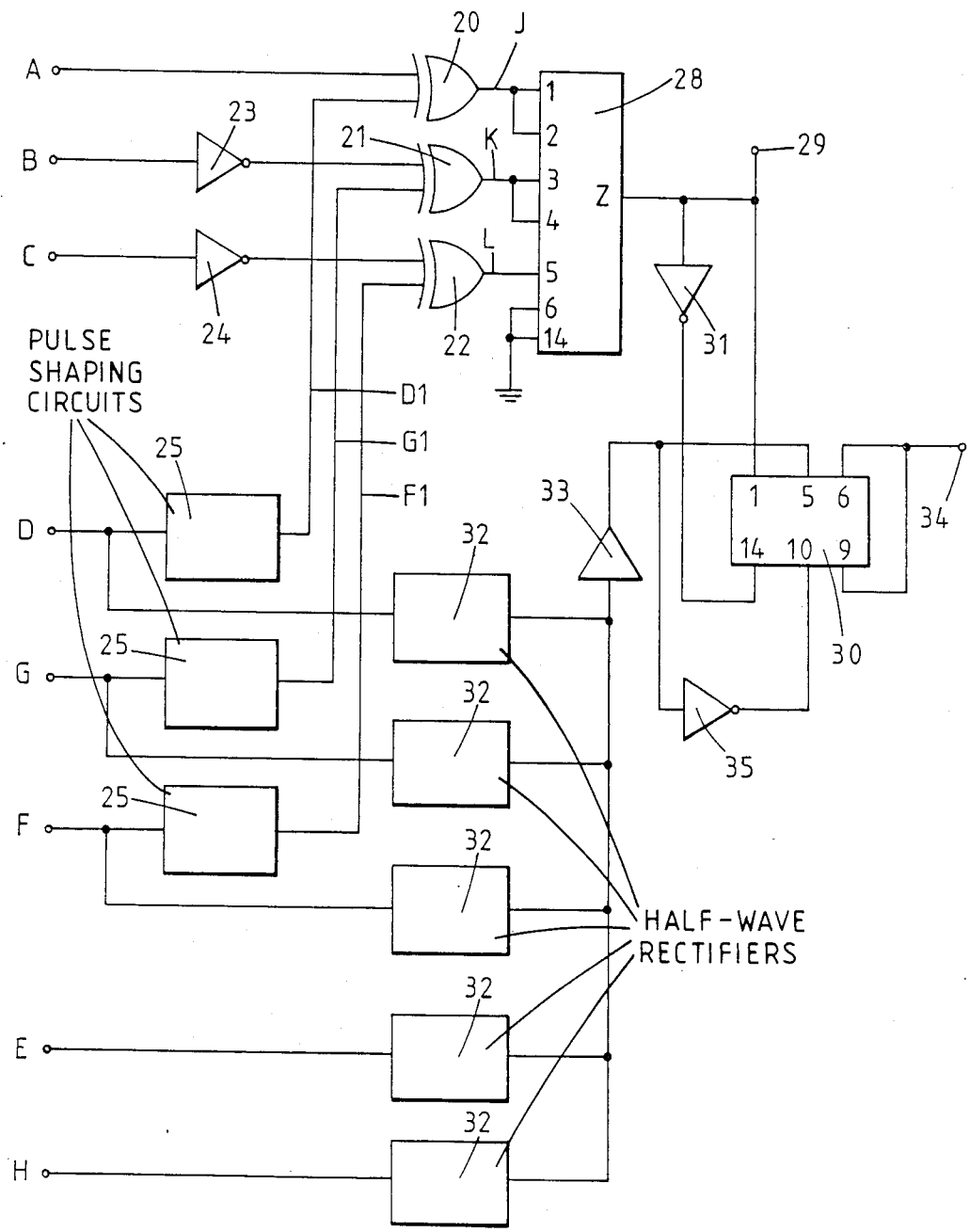
Figure 4:
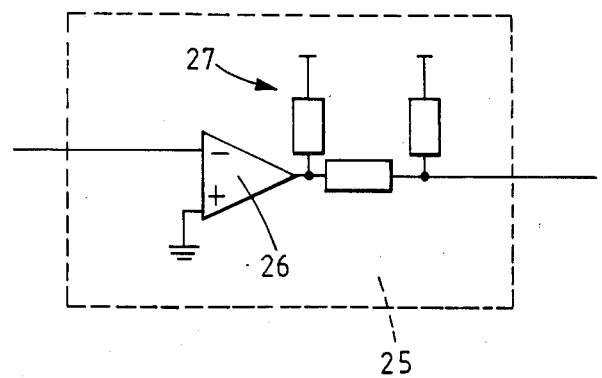
Figure 5:
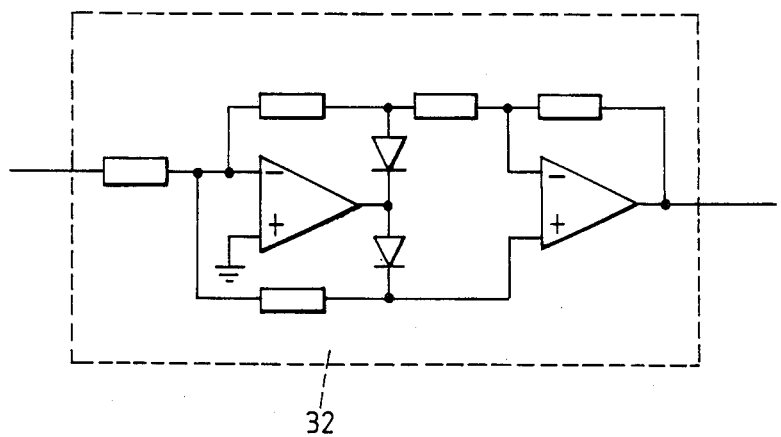
Figure 6:
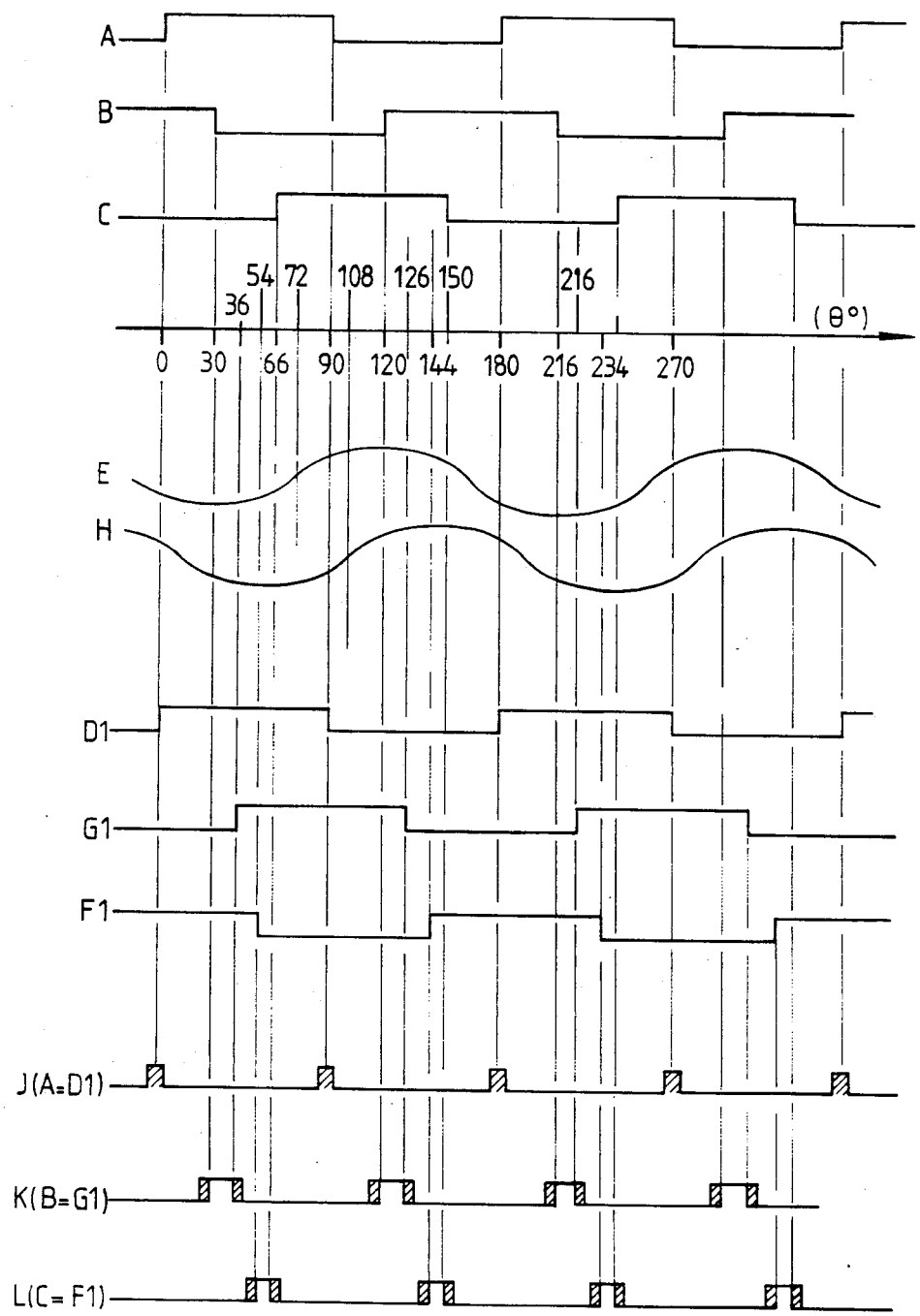

An embodiment of the invention will now be described by way of example only and with reference to the accompanying drawings in which:

FIG. 1 is a pictorial and diagrammatic view of part of an apparatus according to the invention, FIG. 2 is an end view, corresponding to FIG. 1 and showing more clearly the angular relationships of the magnetic poles and detector devices, FIG. 3 is a diagram of a circuit responsive to voltage signals from the detector devices of FIGS. 1 and 2, FIGS. 4 and 5 show details of the circuit of FIG. 3, and FIG. 6 is a timing diagram of voltage signals resulting from clockwise rotation of the device of FIGS. 1 and 2.

As shown in FIG. 1 a rotor 10 is mounted on a shaft 11 which in the present example is the shaft of a brushless d.c. motor. Mounted in the periphery of the rotor 10 are four equi-angularly spaced permanent magnets 12 which are arranged so that effective poles of adjacent magnets are dissimilar. Mounted on a relatively fixed part (not shown) of the apparatus are three Hall sensors 13a–13c which are spaced 120° apart and located relative to the rotor 10 so as to respectively generate positive-going rectangular wave signals A, C, B on correspondingly designated lines (FIG. 2) in response to the presence of a north pole only. Also mounted on the fixed part of the apparatus are five equi-angularly spaced sensors 14a–14e which provide sinusoidal voltage output signals D to H on correspondingly designated lines (FIG. 2), these latter signals alternating with the polarity of the magnets 12 and being dependent on the direction of rotation of the rotor 10. In the example described the signals D to H are considered as being positive-going in response to clockwise rotation of an adjacent north pole, or to anticlockwise rotation of an adjacent south pole. As shown in FIG. 6 each of the sensors 13, 14 reacts with the magnets 12 to provide positive-going output signals of 90° duration.

FIG. 2 shows more clearly the relative angular positions of the sensors 13, 14. It is to be understood that FIGS. 1 and 2 are diagrammatic only, the relative radial positions of the sensors being distorted somewhat for clarity.

The sensors 13 include, as is well known in the art, pulse-shaping circuits and, as shown in FIG. 6, for clockwise rotation provide rectangular wave output signals in the sequence A, B, C. For the same clockwise rotation the sensors 14 provide sinusoidal outputs whose positive-going zero crossing points occur in the sequence D, G, E, H, F. As shown in FIG. 3 the signal A is applied to one input of an exclusive OR gate 20 and the signals B, C are applied to one input of respective exclusive OR gates 21, 22 by way of respective inverters 23, 24. The signals D, G, F are applied to respective identical pulse shaping circuits 25, one of which is shown in FIG. 4 and includes a comparator 26 and a resistor network 27. The resulting rectangular output signals D1, G1, F1 are applied to the second inputs of the respective gates 20, 21, 22. The time relationships of the signals A, B, C, E, H, D1, G1, F1 are shown in FIG. 6 as are the output signals J, K, L from the respective gates 20, 21, 22.

Operation of the gates 20, 21, 22 may readily be understood from the following table which refers to the signals A and D1.

| Direction of rotation | Pole of magnet 12 | Signal A | Signal D1 | J |
|---|---|---|---|---|
| Clockwise | N | high | high | 0 |
| Anticlockwise | N | high | low | 1 |
| Anticlockwise | S | low | high | 1 |
| Clockwise | S | low | low | 0 |

It will be seen that direction of rotation is indicated by the exclusive OR (or inequality) gate 20, which is arranged to provide a low level signal in the presence of equality, indicating clockwise rotation. Inversion of the signals B and C has the effect that the gates 21, 22 respectively provide low level signals in the presence of inequality between signals B and G1 and between signals C and F1. It will be seen that an indication of direction of rotation may be obtained from the signals A and D only. However, though for clockwise rotation as described the signal J is theoretically a constant low level signal, it may include zones of uncertainty, which are shown shaded, arising coincident with the leading and trailing edges of the signals A and D as a result of tolerances on the relative angular positions of the sensors 13a, 14a. The zones of uncertainty in signal J may render the direction of rotation indeterminate at those times. The problem is overcome by use of signals K and L which are derived from signals B and C and two others of the signals E to H. Selection of the appropriate two of the signals E to H is made on the basis that the one of the signals E to H which is most nearly opposite in phase with the signal B or C is compared with the latter, and also on the basis that the positive-going parts of the signals K and L, and their associated zones of uncertainty, do not overlap in time with each other or with the uncertainty zones of signal J. Selection of signals for comparison is extended by the fact that it is only the relative time relationships of the zero crossing points of the signals A-H which need to be taken into account since positive-going signals may be compared with negative-going signals if an inversion of one of these signals is made before comparison. The signals K and L are also low level signals having positive-going pulses at 90° intervals of rotation of the rotor 10, these positive-going pulses also being accompanied by zones of uncertainty.

Reverting to FIG. 3, the signals J, K, L, are applied to a majority logic gate 28 of a type commercially available under the designation 4530 which provide a high level output signal if three or more of its input signals are at a low level. The output signal from the gate 28 is detectable at a terminal 29, a low level signal indicating clockwise rotation of the rotor 10, as viewed in FIGS. 1 and 2. The output signal from the gate 28 is applied to a control terminal of a semi-conductor switch device 30 of a type commercially available under the designation HI 200. The output of the gate 28 is also applied through an inverter 31 to a further control terminal of the switch device 30. Input signals D-H are applied to respective ones of identical precision half-wave rectifier circuits 32 one of which is shown in FIG. 5.

The circuit of FIG. 5 overcomes inaccuracies which arise from the direct rectification of small a.c. signals as a result of non-linearity of the forward characteristics of diodes. The half-wave rectified outputs are summed by an amplifier 33, the phase difference between them resulting in a substantially constant d.c. level whose magnitude is proportional to the speed of the rotor 10. This d.c. level is applied to an input 5 of the switch device 30 which is responsive to a low level signal at the terminal 29 to connect the input 5 to an output terminal 34. The d.c. level at 33 is also applied through an inverter 35 to a further input 10 of the switch device 30 which is connected to the output terminal 34 by a low level signal from the inverter 31.

The effect is that a low level signal at the terminal 29 indicates clockwise rotation of the rotor 10 and this signal also applies the d.c. level at 33 to the terminal 34. A high level signal at terminal 29 is converted to a low level by the inverter 31 and causes the inverted level at 33 to be applied to the terminal 34. The signal at the terminal 34 thus provides, by its magnitude and polarity, an indication of the speed and direction of rotation of the rotor 10. The gate 28, by its response to correspondence between any two of the signals J, K, L has the effect that the pulses and/or zones of ambiguity therein do not affect the output signal from the gate 28 since these pulses and zones do not coincide in time.

It will be apparent that anti-clockwise rotation of the rotor 10 results in the signals D1, G1, F1 being inverted from those shown in FIG. 6 whereby the signals J, K, L are high level signals with negative-going pulses and/or zones of ambiguity. The effect is that a high level signal is provided at the terminal 29, indicating anti-clockwise rotation and the output signal from the inverter 35 is applied to the terminal 34.

In alternative embodiments the rotor 10 may comprise, or form part of, the rotor of a brushless d.c. motor, in which case the Hall sensors 13 may also be those used for timing the commutation of the motor.

When the sensors 13 are so used the angular relationship between them and the poles of the motor must be precisely set, as is usual in the art.

Though in the embodiments described three phase outputs D, F and G, out of a total of five such phase outputs, are compared with the respective outputs of the sensors 13, so that two out of three of the compared results J, K, L will always correspond, it will be understood that for other total numbers of phase outputs other number of comparisons are possible such that the majority logic gate 28 always provides an uninterrupted output signal.

It is to be understood that alternative forms of sensor may be substituted for the Hall sensors 13, provided that these sensors give an output signal indicative of the rotational position of the rotor 10.

It is also to be understood that in alternative embodiments the sensors 13a, 14a need not be angularly aligned about the axis of the rotor 10, as shown in FIG. 1, nor be responsive to the same one of the magnets 12 on each occasion. It is necessary only that the sensor 13a shall provide an output signal A which is substantially coincident with one polarity of the alternating output signal from the sensor 14a, to enable the signals A and D1 to be compared. In such an embodiment the sensors 13a, 14a may be mutually angularly and axially spaced, and be responsive to separate magnets on different parts of a rotor, without affecting the relationship of the signals A, D1 and J shown in FIG. 6.

In a particular embodiment the sensors 13a, 13b, 13c comprise the stator windings of a three phase rotary electric machine, the rotor 10 being secured to the rotor of the machine for rotation therewith.

What is claimed is:

1. An apparatus for sensing the direction of rotation of a device, comprising a rotor for rotation with said device, first and second detectors mounted on a relatively fixed part of said apparatus, at least one pair of magnets mounted on said rotor so as respectively to present opposite magnetic poles to said first detector, said first detector being responsive to the flux from said magnets for providing a first voltage signal whose polarity is dependent on the polarity and direction of rotation of an adjacent one of said magnets, and said second detector providing a second voltage signal in response only to one of said magnetic poles, said second voltage signal being substantially coincident with one polarity of said first signal, means for comparing said first and second voltage signals from said first and second detectors, and means for providing first or second direction indicating signals which are respectively dependent on the correspondence or non-correspondence between the polarities of said first and second voltage signals.

2. An apparatus as claimed in claim 1 which includes means for rectifying the voltage signal from said first detector, the magnitude of said rectified voltage representing the speed of rotation of said device.

3. An apparatus as claimed in claim 2 which includes means for providing an output voltage whose magnitude depends on the magnitude of said rectified voltage and whose polarity depends respectively on the presence of said first or said second direction indicating signal.

4. An apparatus as claimed in claim 1 which includes a plurality of said first detectors angularly spaced around the axis of said rotor, a plurality of third detectors angularly spaced with respect to each other and to said second detector, said third detectors respectively generating third voltage signals in response only to the presence of one of said magnetic polarities, and a plurality of means for comparing voltage signals originating from selected ones of said first detectors with respective ones of said third voltage signals, said means for providing said first or second indicating signals being responsive to correspondence between output signals from a majority of said comparing means.

5. An apparatus as claimed in claim 4 in which said third detectors are angulary positioned so that their respective third voltage signals are substantially opposite in phase to the voltage signals from said selected ones of said first detectors.

6. An apparatus as claimed in claim 5 which includes a plurality of means for rectifying the voltage signals from respective ones of said first detectors, and means for summing said rectified voltages.

7. An apparatus as claimed in claim 4 which includes a plurality of means for rectifying the voltage signals from respective ones of said first detectors, and means for summing said rectified voltages.

* * * * *